(12) United States Patent
Fossum

(10) Patent No.: US 6,744,084 B2
(45) Date of Patent: Jun. 1, 2004

(54) TWO-TRANSISTOR PIXEL WITH BURIED RESET CHANNEL AND METHOD OF FORMATION

(75) Inventor: Eric R. Fossum, Wolfeboro, NH (US)

(73) Assignee: Micro Technology, Inc., Boise, ID (US)

( * ) Notice: Subject to any disclaimer, the term of this patent is extended or adjusted under 35 U.S.C. 154(b) by 0 days.

(21) Appl. No.: 10/230,079

(22) Filed: Aug. 29, 2002

(65) Prior Publication Data
US 2004/0043529 A1 Mar. 4, 2004

(51) Int. Cl.[7] .............................................. H01L 31/062
(52) U.S. Cl. ..................... 257/292; 257/291; 257/347; 257/222
(58) Field of Search .................................. 257/222, 291, 257/292, 347

(56) References Cited

U.S. PATENT DOCUMENTS 5,614,744 A * 3/1997 Merrill ....................... 257/291
6,150,683 A 11/2000 Merrill et al.
6,232,626 B1 * 5/2001 Rhodes ...................... 257/292
6,465,846 B1 * 10/2002 Osanai ...................... 257/347
6,545,302 B2 * 4/2003 Han ........................... 257/222

OTHER PUBLICATIONS

"A 5.5μm CMOS Image Sensor Cell Utilizing A Buries Reset Channel" by Mabuchi et al, 1997 Symposium on VLS Technology Digest of Technical Papers, pp. 75–76.

* cited by examiner

Primary Examiner—David Nelms
Assistant Examiner—Dao H. Nguyen
(74) Attorney, Agent, or Firm—Dickstein Shapiro Morin & Oshinsky LLP (57) ABSTRACT

A two-transistor pixel of an imager has a reset region formed adjacent a charge collection region of a photodiode and in electrical communication with a gate of a source follower transistor. The reset region is connected to one terminal of a capacitor which integrates collected charge of the photodiode. The charge collection region is reset by pulsing the other terminal of the capacitor from a higher to a lower voltage.

22 Claims, 6 Drawing Sheets

TWO-TRANSISTOR PIXEL WITH BURIED RESET CHANNEL AND METHOD OF FORMATION

FIELD OF THE INVENTION

The present invention relates to a method and apparatus for resetting a charge collection node of a CMOS imager pixel.

BACKGROUND OF THE INVENTION

CMOS imagers have been increasingly used as low cost imaging devices. A CMOS imager circuit includes a focal plane array of pixel cells, each one of the cells typically including a photodiode for integrating photo-generated charge in the underlying portion of a substrate, a source follower transistor which receives a voltage from the photodiode and provides an output signal, and a reset transistor for resetting the photodiode to a predetermined voltage before a charge integration period. In some implementations a transfer transistor may be used to transfer charge from the photodiode to a diffusion node connected to the source follower transistor.

Figure 1:
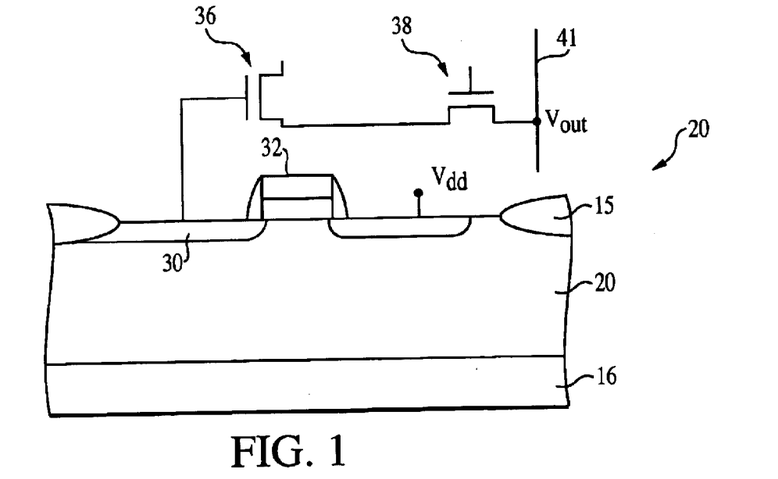
FIG. 1 is a schematic illustration of a conventional exemplary 3T pixel cell.

FIG. 1 illustrates a known three-transistor (3T) pixel cell 20. As shown in FIG. 1, the photocollection region 30 of a photodiode is electrically connected to the gate of a source follower transistor 36, the output of which is selectively applied to column output line 41 by row select transistor 38. Reset transistor 32 selectively resets the photocollection region 30 to a predetermined voltage by coupling a voltage Vdd to the photocollection region 30 during a reset period which precedes or follows a charge integration period. A four-transistor (4T) design provides a transfer transistor to switch charge from the photocollection region 30 to the gate of source follower transistor 36.

While the 3T and 4T pixel cell structures work well, there is an ever increasing desire to minimize the number of transistors used in a pixel to reduce pixel size and increase pixel density in an array. There is also a further desire to simplify overall pixel design and fabrication complexity.

BRIEF SUMMARY OF THE INVENTION

The present invention provides a simplified two-transistor (2T) pixel for a CMOS active pixel imager which omits a conventional reset transistor in favor of a buried reset channel region for resetting a charge collection region of a photodiode. The reset region is provided between a voltage source and a photodiode. Reset is accomplished by applying a pulse voltage to one side of a capacitor, the other side of which is coupled to the reset region which forces charge to be ejected from the photodiode.

These and other advantages and features of the present invention will be apparent from the following detailed description and accompanying drawings which illustrate preferred embodiments of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "substrate" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting light radiation to an electrical signal. For purposes of illustration, a representative pixel is illustrated in the figures and description herein and, typically, fabrication of all pixels in an imager will proceed simultaneously in a similar fashion. Also, although the invention is described below showing one exemplary cross-sectional arrangement of the pixel cell as fabricated in a substrate, it should be apparent that many other arrangements are also possible.

Referring now to the drawings, where like elements are designated by like reference numerals, FIGS. 2–7 illustrate an exemplary embodiment of a method of forming a two-transistor CMOS pixel 100 (FIG. 7) having a buried reset region 199 formed in contact with and adjacent a charge collection region 126 of a photodiode 188, which also has a region 124 over region 126 which is of complementary conductivity type to region 126. The reset region 199 acts as an extension of charge collection region 126 of photodiode 188 and also functions to reset the extended charge collection region. As explained in detail below, the reset region 199 (FIG. 7) is formed by implanting dopants of a first conductivity, for example n-type, and at a first dopant concentration in a substrate 110, which has a region or well 120 of a second conductivity type, for example p-type. The buried reset channel 199 (FIG. 7) contacts with the charge collection region 126 of the first conductivity type, for example n-type, and is provided with a contact region 177 (FIG. 7) of the first conductivity type, for example n-type. The contact region 177 is further connected by a conductor 137 to a gate of a source follower transistor 136, the output of which (drain 140) is connected to a row select transistor 138.

The contact region 177 is also connected to one side of a charge capacitor 171, the other side of which receives a signal Vpd from reset signal source 176. A region 166 of the second conductivity type, for example p-type, is also fabricated within the buried reset channel 199 and is electrically coupled to the photodiode 188 region 124 through a conductivity segment 157. The conductive segment 157 may be formed as a continuation of doped regions 124 and 166 into or out of the plane of the FIG. 7 cross-section illustration such that they merge. The doping concentration of the buried reset channel 199 is higher than the doping concentration of the charge collection region 126, causing electrons produced at region 126 to flow through the buried reset channel 199 to the contact region 177 and the regions 126 and channel 199 to collectively act as a charge collection region of photodiode 188. The manner in which the FIG. 7 structure is fabricated will be described below.

Figure 2:
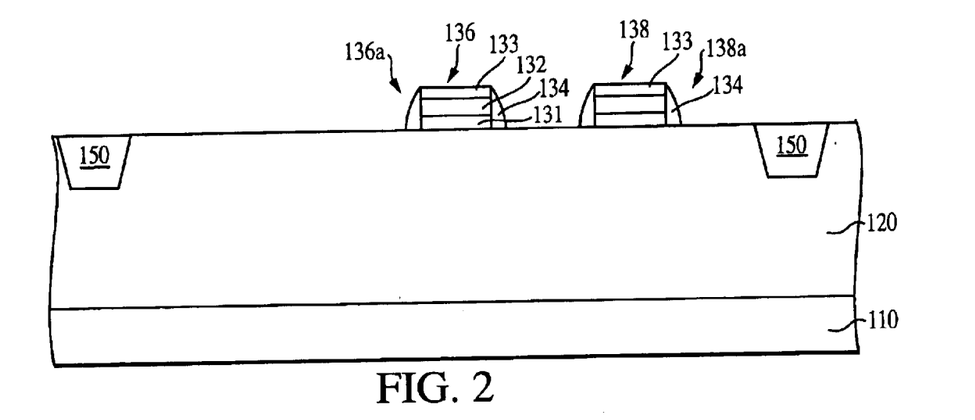
FIG. 2 is a substrate cross-sectional view of the beginning stage of fabrication of a pixel cell in accordance with the present invention.

One exemplary method of fabricating the FIG. 7 structure will now be described with reference to FIGS. 2–7. FIG. 2 illustrates a cross-sectional view of substrate 110 on and within which the formation of elements of the pixel 100 will be described. For exemplary purposes, the substrate 110 is a silicon substrate. However, as noted above, the invention has equal application to other semiconductor substrates.

FIG. 2 illustrates two isolation regions 150 which surround and isolate fabricated pixels. Multi-layered gate stacks 136a and 138a of source follower and row select transistors 136 and 138, respectively, are formed over the silicon substrate 110 within the area defined by the isolation regions 150. The source follower and row select gate stacks 136a, 138a comprise a first gate oxide layer 131 of grown or deposited silicon oxide on the silicon substrate 110, a conductive layer 132 of doped polysilicon or other suitable conductor material, and a second insulating layer 133, which may be formed of, for example, silicon oxide (silicon dioxide), nitride (silicon nitride), oxynitride (silicon oxynitride), ON (oxide-nitride), NO (nitride-oxide), or ONO (oxide-nitride-oxide). The first and second insulating layers 131, 133 and the conductive layer 132 may be formed by conventional deposition methods, for example, chemical vapor deposition (CVD) or plasma enhanced chemical vapor deposition (PECVD), among many others.

Figure 4:
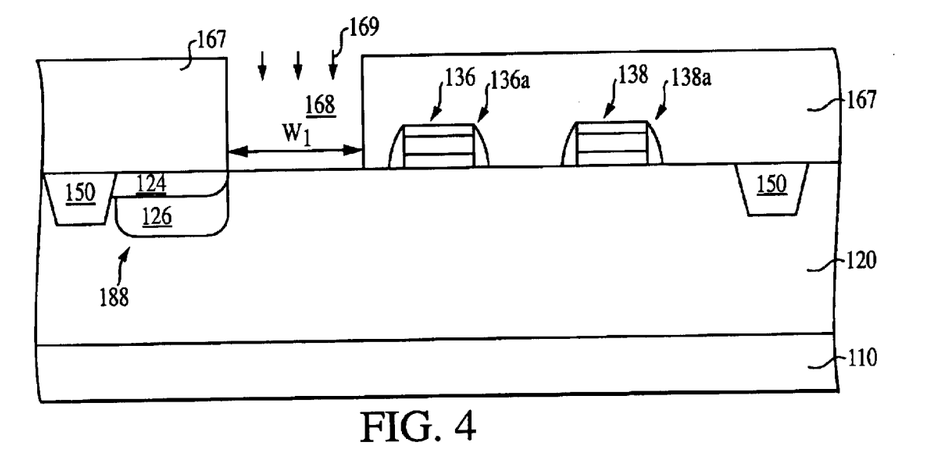
FIG. 4 is a substrate schematic cross-sectional view of the pixel cell at a stage of processing subsequent to that shown in FIG. 3.

If desired, a silicide layer (not shown) may be also formed in the multi-layered gate stacks 136a, 138a between the conductive layer 132 and the second insulating layer 133. Advantageously, the gate structures of all other transistors in the imager circuit design may have this additionally formed silicide layer. This silicide layer may be titanium silicide, tungsten silicide, cobalt silicide, molybdenum silicide, or tantalum silicide. The silicide layer could also be a barrier layer/refractory metal such as TiN/W or $WN_x$/W or it could be entirely formed of $WN_x$. FIG. 4 also illustrates insulating sidewall spacers 134 formed on the sides of the source follower gate 136a and of the row select gate 138a. The sidewall spacers 134 may be formed, for example, of silicon dioxide, silicon nitride, silicon oxynitride, ON, NO, ONO or TEOS, among others.

The isolation regions 150 which are formed within the substrate 110 are filled with a dielectric material, which may be an oxide material, for example a silicon oxide such as SiO or $SiO_2$, oxynitride, a nitride material such as silicon nitride, silicon carbide, a high temperature polymer, or other suitable dielectric materials. In a preferred embodiment, however, the isolation regions 150 are shallow trench isolation regions and the dielectric material is a high density plasma (HDP) oxide, a material which has a high ability to effectively fill narrow trenches. Thus, for simplicity, reference to the isolation regions 150 will be made in this application as to the shallow trench isolation regions 150. The shallow trench isolation regions 150 have a depth of about 1,000 to about 4,000 Angstroms, more preferably of about 2,000 Angstroms.

Although FIGS. 2–7 illustrate only a portion of the substrate 110 with only two shallow trench isolation regions 150, it must be understood that the present invention contemplates the simultaneous formation of more than two shallow trench isolation structures at various locations on the substrate 110 to isolate the pixels one from another and to isolate other structures as well.

In addition, if desired, a thin insulating layer (not shown) may be formed on the sidewalls and bottom of the shallow trench before the filling of the trench with the dielectric material which, as noted above, is preferably a high density plasma (HDP) oxide. The thin insulating layer may be formed of an oxide or of silicon nitride, for example, to aid in smoothing out the corners in the bottom of the trench and to reduce the amount of stress in the dielectric material used to later fill in the trenches.

Figure 3:
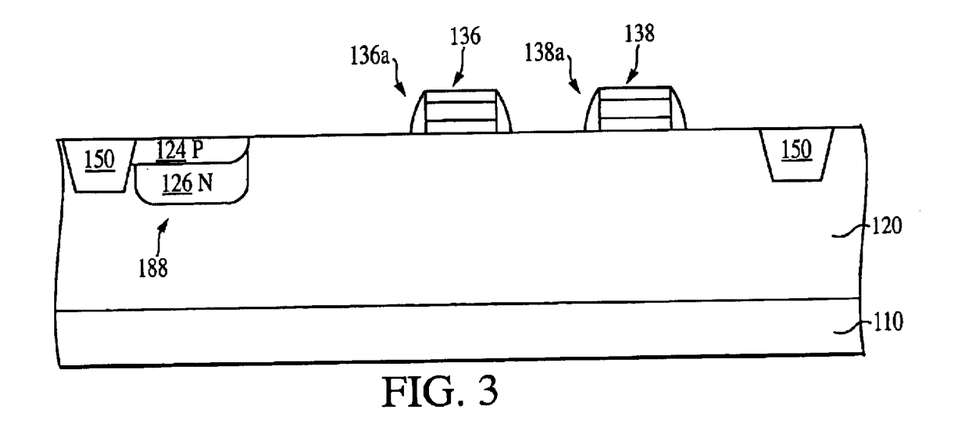
FIG. 3 is a substrate schematic cross-sectional view of the pixel cell at a stage of processing subsequent to that shown in FIG. 2.

Referring now to FIG. 3, a p-n-p photodiode 188 is formed by regions 124, 126 and 120 within the substrate 110. The doping concentration of each of the regions 124, 126 and 120 of the p-n-p photodiode 188 is selected to set a low pinning potential of the p-n-p photodiode 188, that is a pinning potential of less than about 0.5 V, more preferably about 0.3 to less than about 0.5 V. As known in the art, a low pinning potential is desirable since the lower the pinning potential, the lower the electric fields and the lower the dark current in the pixel.

The p-type doped layer 120 is a lightly doped layer formed in an area of the substrate 110 beneath the active area of the pixel 100 formed by conducting a light dopant implantation with a dopant of a first conductivity type, which for exemplary purposes is p-type. The p-type doped layer 120 may be formed subsequent to the formation of the shallow trench isolation (STI) 150 and of the two transistor gate stacks 136a, 138a. However, it must be understood that the p-type doped layer 120 may be also formed prior to the formation of the shallow trench isolation (STI) 150 and/or gate stacks 136a, 138a. Alternatively, layer 120 may be a p-type epitaxial layer formed at the upper portion of substrate 110.

The n-type region 126 (FIG. 3) is formed by implanting dopants of a second conductivity type, which for exemplary purposes is n-type, in an area of the substrate 110 located between the shallow trench isolation (STI) 150 and the transistor gate stacks 136a, 138a. The implanted n-doped region 126 is defined by a mask and forms a photosensitive charge storage region for collecting and storing photogenerated electrons. N-type dopants such as arsenic, antimony, or phosphorous may be employed.

The p-type pinned surface layer 124 is also formed by conducting a masked dopant implantation with a dopant of the first conductivity type, which for exemplary purposes is p-type, so that p-type ions are implanted into the area of the substrate over the implanted n-type region 126 and between the source follower transistor 136 and shallow trench isolation region 150. P-type dopants such as boron, beryllium, indium and magnesium may be employed for the formation of the p-type pinned surface layer 124.

Subsequent to the formation of the p-n-p photodiode 188 and of the source follower and row select transistor gates 136a, 138a, a first photoresist layer 167 (FIG. 4) is formed over the p-n-p photodiode 188 to a thickness of about 1,000 Angstroms to about 10,000 Angstroms. The first photoresist layer 167 (FIG. 6) is patterned to form a first opening 168 (FIG. 6) which, on the left side of FIG. 4, is approximately coincident with the edge of the pinned photodiode 188 (the right most edge of the pinned photodiode 188 in FIG. 6) and, from the right side of FIG. 4 extends over the source follower transistor gate 136.

Figure 5:
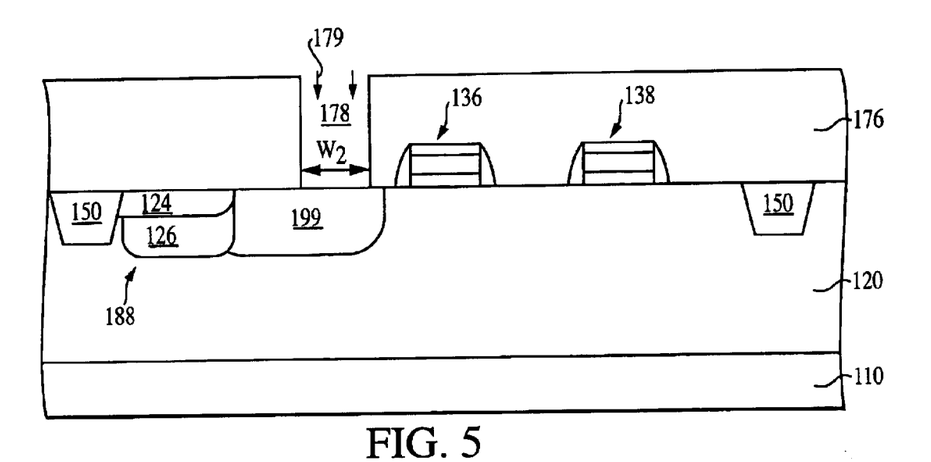
FIG. 5 is a substrate schematic cross-sectional view of the pixel cell at a stage of processing subsequent to that shown in FIG. 4.

Next, the structure of FIG. 4 is subjected to a first dopant implantation 169 with a dopant of the second conductivity type, which for exemplary purposes is n-type. This way, n-type ions are implanted through the first opening 168 to form an n-type implanted reset region 199 located within the p-type doped layer 120 of the substrate 110 and in contact with and adjacent the n-type doped region 126 of the buried photodiode 188, as illustrated in FIG. 5. As described in more detail below, the n-type implanted region 199 is the reset region 199 of the pixel 100 of FIG. 7.

The deep dopant implantation 169 (FIG. 4) is conducted to implant n-type ions, such as arsenic, phosphorus or antimony, into an area of the substrate 110 located adjacent the buried photodiode 188 and a subsequently formed source/drain region 142 (FIG. 7) of the source follower transistor 136. The dopant implantation 169 may be conducted by placing the substrate 110 in an ion implanter and implanting appropriate n-type dopant ions through the first opening 168 (FIG. 6) into the substrate 110. The dopant concentration in the buried reset channel region 199 is selected so that its pinning potential is higher than the pinning potential of the buried photodiode 188, to allow free electron flow to and through the buried reset channel region 199 and enable the buried reset channel region 199 to also function as an "anti-blooming" channel during the pixel signal integration period. The first photoresist layer 167 is then removed by conventional techniques.

Subsequent to the formation of the n-type buried reset channel region 199, a second photoresist layer 176 (FIG. 5) is formed over the p-n-p photodiode 188 and the transistor gate stacks 136, 138 to a thickness of about 1,000 Angstroms to about 10,000 Angstroms. The second photoresist layer 176 (FIG. 5) is patterned with a mask (not shown) to obtain a second opening 178 (FIG. 5), which is located above at least a portion of the implanted reset channel region 199 and has a width $W_2$ (FIG. 5) which is smaller than width $W_1$ (FIG. 4) of the first opening 168.

Figure 6:
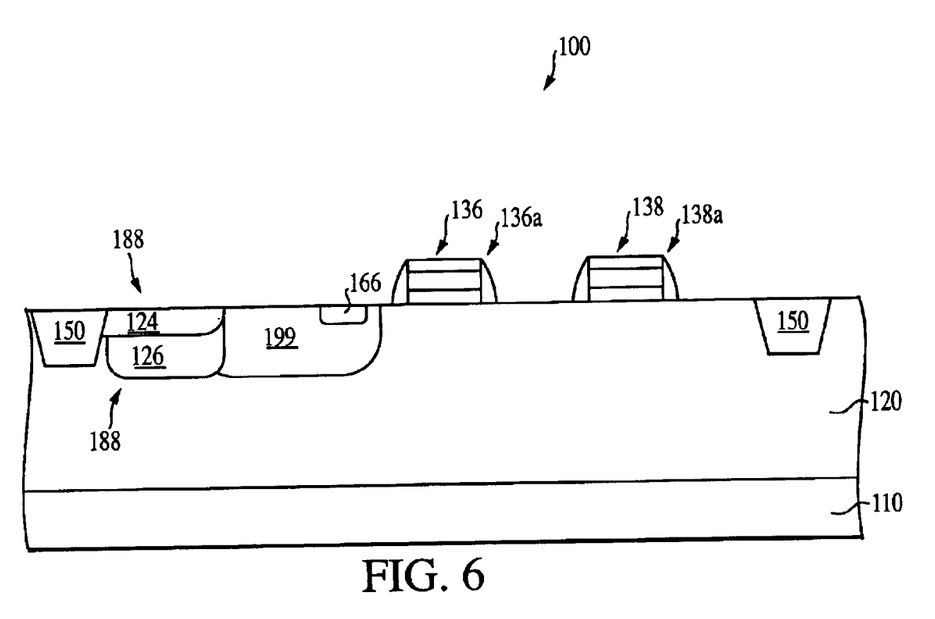
FIG. 6 is a substrate schematic cross-sectional view of the pixel cell at a stage of processing subsequent to that shown in FIG. 5.

The structure of FIG. 5 is subjected to a second masked dopant implantation 179 (FIG. 7) with a dopant of the first conductivity type, which for exemplary purposes is p-type. This way, p-type ions are implanted through the second opening 178 (FIG. 7) to form a p-type implanted region 166 located within the buried reset channel region 199, as illustrated in FIG. 6. The second dopant implantation 179 is conducted to implant p-type ions, such as boron, beryllium, indium or magnesium, into an area of the substrate 110 located within the buried reset channel region 199. The dopant implantation 179 may be conducted by placing the substrate 110 in an ion implanter and implanting appropriate p-type dopant ions through. the second opening 178 (FIG. 7) into the substrate 110. The implanted region 166 together with the reset channel region form a diode which can be fabricated to impart particular charge flow properties within the reset channel region 199.

The FIG. 6 structure is then covered with another resist layer and an opening is patterned therein to provide a location for a contact region 177 (FIG. 7) within the buried reset channel 199. Contact region 177 is formed by conducting a dopant implantation with n-type ions, such as arsenic, phosphorus or antimony. The dopant concentration in the contact region 177 is higher than the dopant concentration in the buried reset channel region 199.

Figure 7:
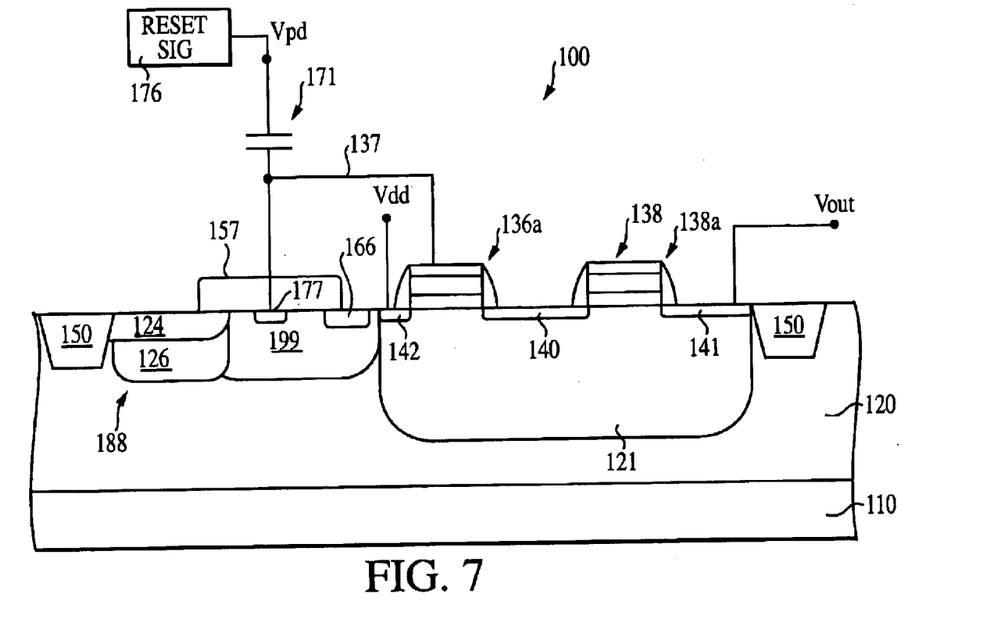
FIG. 7 is a substrate schematic cross-sectional view of the pixel cell at a stage of processing subsequent to that shown in FIG. 6.

FIG. 7 illustrates a charge capacitor 171 electrically connected to a voltage source Vpd 176 (normally high at about 3.3 V) and to the reset region 199 through the contact region 177 of the first conductivity type. Preferably, the charge capacitor 171 has a high charge-per-unit area capacitance, of about 5 to about 10 $fF/\mu m^2$. The charge capacitor 171 may be formed over a portion of the pixel area defined by the STI regions 150 which surround the pixel, or elsewhere in the integrated circuit, as desired.

FIG. 7 also illustrates the remaining devices of the pixel 100, including respective source/drain regions 140, 141, 142 of the source follower and row select transistors 136, 138 formed on either sides of their respective gate stacks and within a p-type heavily doped well 121 by well-known implantation methods. Regions 121, 140, 141 and 142 may be formed at an earlier stage of fabrication, if desired. Conventional processing steps may be also employed to form contacts and wiring 137 to connect the gate of source follower transistor to contact region 177, and to connect capacitor 171 to contact region 177. For example, the entire substrate surface may be covered with a passivation layer of, e.g., silicon dioxide, BSG, PSG, or BPSG, which is CMP planarized and etched to provide contact holes, which are then metallized to provide contacts to the contact region 177, gate 136a of the source follower transistor (via conductor 131) and to voltage source Vdd. Conventional multiple layers of conductors and insulators to other circuit structures may also be used to interconnect the internal structures of the pixel cell and to connect the pixel cell structures to other circuitry associated with a pixel array.

Figure 9:
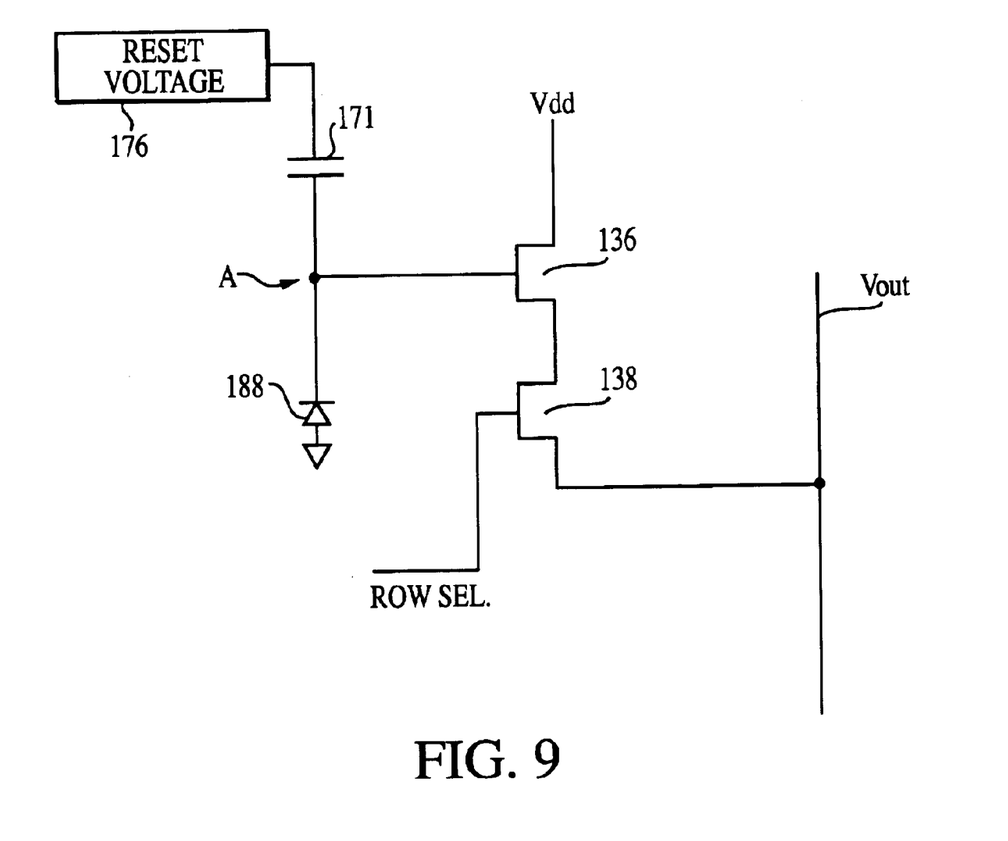
FIG. 9 is a schematic diagram of the pixel structure depicted in FIG. 7.

The electrical equivalent circuit for the two transistor pixel constructed in accordance with the invention is shown in FIG. 9.

Figure 8:
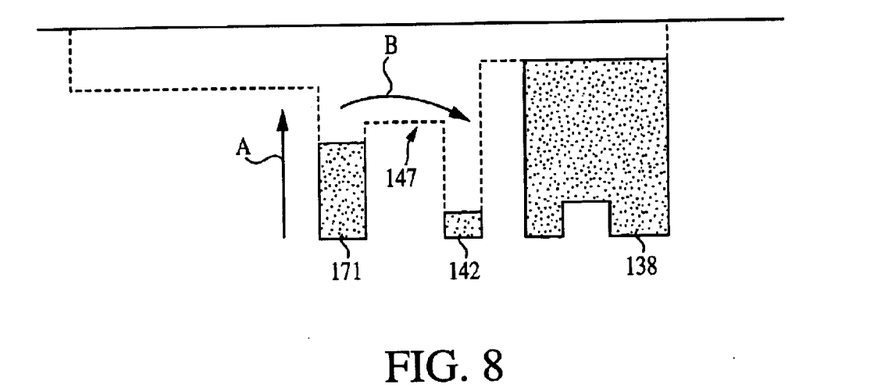
FIG. 8 illustrates a schematic diagram of the barrier potential of the pixel cell of FIG. 7.

Referring to FIGS. 7 and 8, when light radiation in the form of photons strikes the n-doped charge collection region 126 of the photodiode 188, photo-energy is converted to electron-hole pairs. For the case of an n-doped photosite in a p-n-p photodiode, it is the electrons that are accumulated in the n-doped region 126. Because of the difference in doping concentration between regions 126 and 199, generated electrons freely flow into reset region 199 where they collect. During read out of a pixel signal contact region 177 provides a voltage representing accumulated charge to the gate of the source follower transistor.

Thus, when Vpd from a reset signal source 176 is normally high, for example 3.3 V, electrons from charge collection region 126 easily flow to the n-doped buried reset channel 199 which acts as an extension of charge collection region 126 to contact 177, where the electrons are stored on capacitor 171. The voltage associated with the charge stored on capacitor 171 is applied to the gate 136a of the source follower transistor 136 where it is amplified and read out as output Vout through row select transistor 138 when the gate 138*a* of the row select transistor 138 is enabled.

The pixel is also reset before and after signal integration. Referring to FIGS. 7 and 8 during reset, the normally high voltage Vpd coupled to capacitor 171 from reset signal source 176 is pulsed low, e.g., to zero volts. This causes the charge within reset region 199 to effectively move upwardly in the direction of arrow A such that charges within channel 199 spill over barrier 147 into n+ region 142 which is connected to Vdd. Thus, charges are ejected from the photodiode region 126 and the reset region 199 and into n+region 142 connected to Vdd. Vpd is then returned to a high value, for example 3.3 V, allowing charge integration to occur. This integrated charge is then read out in the manner described above. The barrier potential 147 is set to allow an anti-blooming operation to occur when charges collected on capacitor 171 in region 199 exceed the barrier potential 145. This excess charge spills over to n+ region 142.

During reset, the Vdd line can also be pulsed low, if desired, to fill the charge collection region 126 with electrons, after which Vdd returns high and Vpd is pulsed low. This causes the electrons in charge collection region 126 to be flushed to Vdd which helps suppress any potential lag in the pixel.

Referring to FIG. 9, light converted to electrons by photodiode 188 provides a voltage at node A to the gate of source follower transistor 136 which is read out as a pixel signal Vsig by row select transistor 138 which is turned on after a light integration period. Node A is reset by the negative, e.g., 0 volt, Vpd pulse applied by reset signal source 176 to one terminal of capacitor 171 which has its other terminal coupled to node A. The reset voltage at node A is read out as a pixel reset signal Vrst by row select transistor 138 which is turned on after node A is reset.

Figure 10:
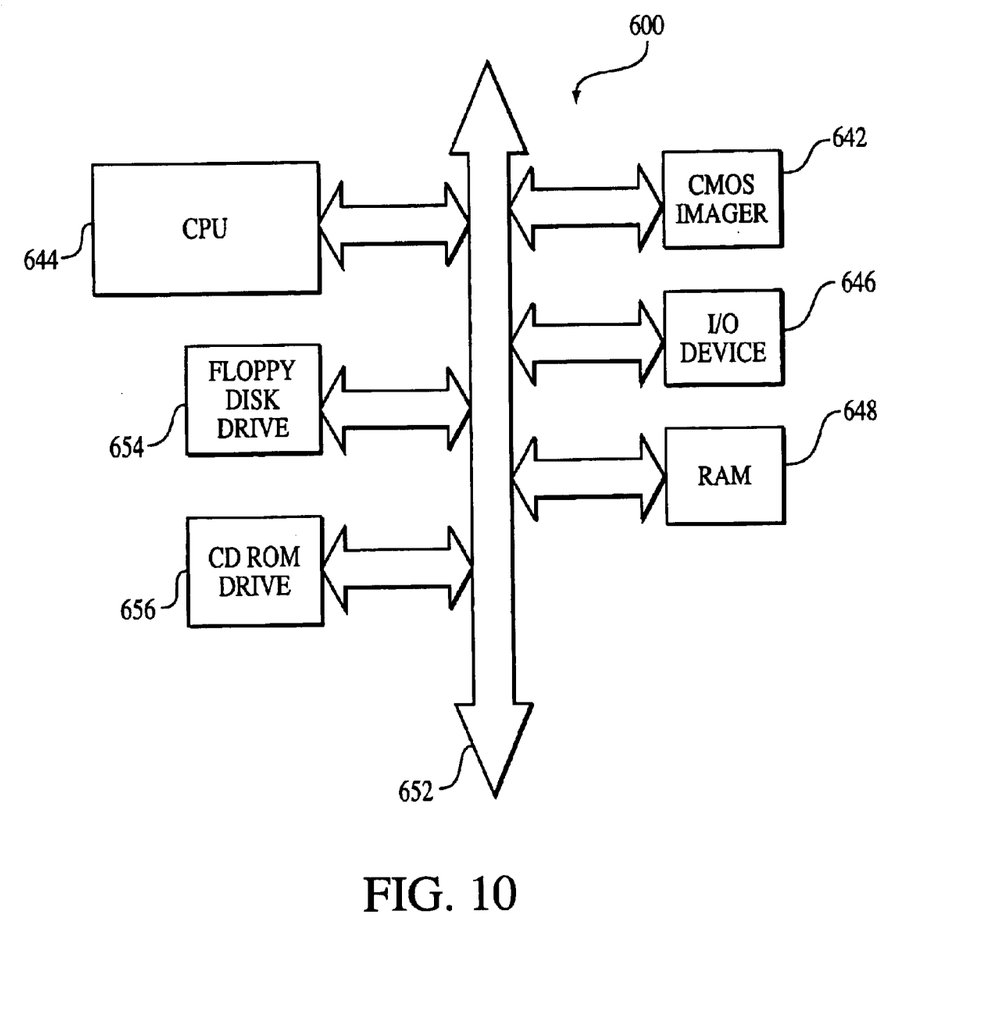
FIG. 10 illustrates a block diagram of a computer processor system incorporating an imager device having an array of pixels fabricated according to the present invention.

The pixel structure herein may be employed in an imager device 642 having an array of pixels and associated pixel processing circuitry, at least one of the pixels being a 2T pixel constructed according to the invention. The imager device 642 itself may be coupled to a processor system as illustrated in FIG. 10. Processor system 600 is exemplary of a system having digital circuits which could receive the output of CMOS image device 642. Without being limiting, such a system could include a computer system, camera system, scanner, machine vision, vehicle navigation, video phone, surveillance system, auto focus system, star tracker system, motion detection system, image stabilization system and data compression system for high-definition television, all of which can utilize the present invention.

A processor based system, such as a computer system, for example generally comprises, in addition to a CMOS imager 642 input device, a central processing unit (CPU) 644, for example, a microprocessor, that communicates with one or more input/output (I/O) devices 646 over a bus 652. The CMOS image sensor 642 also communicates with the processor system over bus 652 or over other conventional communication path. The computer system 600 also includes random access memory (RAM) 648, and, in the case of a computer system may include peripheral devices such as a floppy disk drive 654, and a compact disk (CD) ROM drive 656 or a flash memory card 657 which also communicate with CPU 644 over the bus 652. It may also be desirable to integrate the processor 654, CMOS image device 642 and memory 648 on a single IC chip.

Although the above embodiments have been described with reference to the formation of an n-type buried reset channel region, such as the n-type buried reset channel region 199, adjacent a buried p-n-p photodiode, it must be understood that the invention is not limited to this embodiment. The invention has equal applicability p-type buried reset channels adjacent buried n-p-n photodiodes and as part of a 2T pixel sensor cell. Of course, the dopant and conductivity type of all structures will change accordingly.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A pixel comprising:
   a substrate;
   a photoconversion device fabricated below a surface of said substrate, said photoconversion device having a charge collection region of a first conductivity type;
   a reset region of said first conductivity type fabricated in said substrate and adjacent said charge collection region for resetting said charge collection region in response to a signal applied to said reset region;
   a pulsed voltage source for causing said reset region to periodically reset said reset region and extended charge collection region, wherein said pulsed voltage source is coupled to one terminal of a capacitor, the other terminal of which is coupled to said extended charge collection region.

2. A pixel as in claim 1 wherein said reset region functions with said charge collection region as an extended charge collection region, said extended charge collection region being reset by said applied signal.

3. The pixel of claim 2 further comprising:
   a source follower transistor for outputting a signal representing charge collected in said extended charge collection region; and
   a capacitor in electrical communication with said reset channel region and said extended source follower transistor for storing charge collected in said charge collection region.

4. The pixel of claim 3 further comprising a row select transistor for selectively outputting a signal from said source follower transistor.

5. The pixel of claim 3 wherein said charge capacitor has a charge-per-unit area capacitance value of about 5 fF/$\mu$m$^2$ to about 10 fF/$\mu$m$^2$.

6. The pixel of claim 2 wherein said first conductivity type is n-type and said second conductivity type is p-type.

7. The pixel of claim 2 wherein said photoconversion device is a buried photodiode formed in a well of a second conductivity type, and wherein said charge collection region is part of said buried photodiode.

8. The pixel of claim 7 wherein said buried photodiode comprises a pinned layer of said second conductivity type, said pinned layer being in electrical communication with a doped region of said second conductivity type located within said reset region.

9. The pixel of claim 2 wherein said reset region is doped with an n-type dopant at a first dopant concentration.

10. The pixel of claim 2 wherein said capacitor is connected to said reset region through a contact region.

11. The pixel of claim 10 wherein said contact region is doped with an n-type dopant at a second dopant concentration.

12. The pixel of claim 11 wherein said second dopant concentration is higher than said first dopant concentration.

13. A pixel for use in an imaging device, said pixel comprising:
   a charge collection region located below a surface of a substrate;
   a reset region formed within said substrate adjacent said charge collection region for periodically resetting a charge level of said charge collection region in response to an applied reset signal, wherein said reset region functions with said charge collection region as an extended charge collection region;
   a capacitor having one terminal in electrical communication with said reset region for storing charge collected in said charge collection region; and
   a pulsable voltage source coupled to another terminal of said capacitor for causing said reset region to reset said charge collection region.

14. The pixel of claim 13 further comprising:
   a source follower transistor in electrical communication with said reset channel region and said capacitor for receiving a voltage stored on said capacitor and outputting a signal representing charge accumulated in said extended charge collection region.

15. The pixel of claim 14 further comprising a row select transistor for selectively outputting a signal from said source follower transistor.

16. The pixel of claim 14 wherein said capacitor has a charge-per-unit area capacitance value of about 5 to about 10 fF/$\mu$m$^2$.

17. The pixel of claim 14 wherein said reset region is doped with an n-type dopant at a first dopant concentration.

18. The pixel of claim 14 wherein said capacitor is connected to said reset region through a contact region.

19. The pixel of claim 18 wherein said contact region is doped with an n-type dopant at a second dopant concentration.

20. The pixel of claim 19 wherein said second dopant concentration is higher than said first dopant concentration.

21. The pixel of claim 13, wherein said charge collection region is part of a buried photodiode.

22. The pixel of claim 21, wherein said buried photodiode comprises a pinned layer, said pinned layer being in electrical communication with a doped region located within said reset region.

* * * * *

UNITED STATES PATENT AND TRADEMARK OFFICE
CERTIFICATE OF CORRECTION

PATENT NO. : 6,744,084 B2  
DATED : June 1, 2004  
INVENTOR(S) : Eric R. Fossum It is certified that error appears in the above-identified patent and that said Letters Patent is hereby corrected as shown below:

<u>Title page,</u>
Item [73], Assignee, change "Micro" to -- Micron --.

Signed and Sealed this

Sixteenth Day of November, 2004

JON W. DUDAS
*Director of the United States Patent and Trademark Office*